US011177264B2

(12) United States Patent
Jeon et al.

(10) Patent No.: US 11,177,264 B2
(45) Date of Patent: Nov. 16, 2021

(54) SEMICONDUCTOR DEVICES INCLUDING A GATE STRUCTURE HAVING MULTIPLE WIDTHS

(71) Applicant: Samsung Electronics Co., Ltd., Suwon-si (KR)

(72) Inventors: Jae-hyeon Jeon, Seongnam-si (KR); Se-keun Park, Suwon-si (KR); Dong-sik Park, Suwon-si (KR); Seok-ho Shin, Seoul (KR)

(73) Assignee: Samsung Electronics Co., Ltd.

( * ) Notice: Subject to any disclaimer, the term of this patent is extended or adjusted under 35 U.S.C. 154(b) by 30 days.

(21) Appl. No.: 16/566,510

(22) Filed: Sep. 10, 2019

(65) Prior Publication Data

US 2020/0168611 A1    May 28, 2020

(30) Foreign Application Priority Data

Nov. 26, 2018 (KR) .................. 10-2018-0147680

(51) Int. Cl.
| | | |
|---|---|---|
| *H01L 27/108* | (2006.01) | |
| *H01L 29/06* | (2006.01) | |
| *H01L 29/423* | (2006.01) | |
| *H01L 21/306* | (2006.01) | |
| *H01L 21/28* | (2006.01) | |

(52) U.S. Cl.
CPC .. *H01L 27/10823* (2013.01); *H01L 21/28114* (2013.01); *H01L 21/30604* (2013.01); *H01L 27/10814* (2013.01); *H01L 27/10855* (2013.01); *H01L 27/10876* (2013.01); *H01L 27/10885* (2013.01); *H01L 29/0653* (2013.01); *H01L 29/4236* (2013.01); *H01L 29/42376* (2013.01)

(58) Field of Classification Search
CPC ......... H01L 27/10814; H01L 27/10823; H01L 27/10876; H01L 27/10885; H01L 29/4236; H01L 29/7825
See application file for complete search history.

(56) References Cited

U.S. PATENT DOCUMENTS

| | | |
|---|---|---|
| 7,153,733 B2 | 12/2006 | Seo et al. |
| 7,250,342 B2 | 7/2007 | Kim |

(Continued)

FOREIGN PATENT DOCUMENTS

| | | |
|---|---|---|
| JP | 2008-078644 | 4/2008 |
| KR | 10-2004-0064924 | 7/2004 |

(Continued)

*Primary Examiner* — Hoai V Pham
(74) *Attorney, Agent, or Firm* — Myers Bigel, P.A.

(57) ABSTRACT

Semiconductor devices are provided. A semiconductor device includes a substrate including a plurality of active regions that extend longitudinally in a direction and an isolation region that electrically isolates the plurality of active regions from each other. The semiconductor device includes a gate trench that extends across the plurality of active regions and the isolation region. The semiconductor device includes a gate structure that extends in the gate trench. The semiconductor device includes a gate dielectric layer that is between the gate trench and the gate structure, in each of the plurality of active regions. The gate structure has a first width in the direction in each of the plurality of active regions and has a second width in the direction in the isolation region that is different from the first width.

20 Claims, 11 Drawing Sheets

(56) References Cited

U.S. PATENT DOCUMENTS

| | | |
|---|---|---|
| 7,612,406 B2 | 11/2009 | Kluge |
| 7,701,002 B2 | 4/2010 | Seo et al. |
| 8,048,597 B2 | 11/2011 | Kim |
| 10,608,086 B2* | 3/2020 | Lin .................. H01L 27/10814 |
| 2010/0285644 A1* | 11/2010 | Lee .................. H01L 27/10823 |
| | | 438/239 |
| 2017/0278848 A1 | 9/2017 | Wu |

FOREIGN PATENT DOCUMENTS

| | | |
|---|---|---|
| KR | 10-0513306 | 8/2005 |
| KR | 10-0549008 | 1/2006 |
| KR | 10-2006-0062358 | 6/2006 |
| KR | 10-2007-0003062 | 1/2007 |

\* cited by examiner

SEMICONDUCTOR DEVICES INCLUDING A GATE STRUCTURE HAVING MULTIPLE WIDTHS

CROSS-REFERENCE TO RELATED APPLICATION

This application claims the benefit of Korean Patent Application No. 10-2018-0147680, filed on Nov. 26, 2018, in the Korean Intellectual Property Office, the disclosure of which is incorporated herein in its entirety by reference.

BACKGROUND

The present disclosure relates to semiconductor devices. As the size of a semiconductor device is reduced, a distance between elements is shortened, and due to this, problems may occur. For example, in memory devices, a possibility that interference occurs between two adjacent signal lines may increase with reduced device size.

SUMMARY

The present inventive concepts provide a semiconductor device having an appropriate operation characteristic and high reliability.

The present inventive concepts provide a method of manufacturing a semiconductor device having an appropriate operation characteristic and high reliability.

According to some embodiments of the present inventive concepts, a semiconductor device is provided that includes a substrate including a plurality of active regions that may extend longitudinally in a direction and an isolation region that may electrically isolate the plurality of active regions from each other. The semiconductor device may include a gate trench that extends across the plurality of active regions and the isolation region. The semiconductor device may include a gate structure that extends in the gate trench. The semiconductor device may include a gate dielectric layer that is between the gate trench and the gate structure, in each of the plurality of active regions. Moreover, the gate structure may have a first width in the direction in each of the plurality of active regions and may have a second width in the direction in the isolation region that is different from the first width.

According to some embodiments of the present inventive concepts, a semiconductor device is provided that includes a substrate including a plurality of active regions that may extend longitudinally in a first direction and an isolation region that may electrically isolate the plurality of active regions from each other. The semiconductor device may include a gate trench that extends across the plurality of active regions and the isolation region. The semiconductor device may include a gate structure that extends in the gate trench. The semiconductor device may include a gate dielectric layer that is between the gate trench and the gate structure, in each of the plurality of active regions. Moreover, a width of the gate structure in the first direction may gradually increase or decrease based on a longitudinal position of the gate structure.

According to some embodiments of the present inventive concepts, a semiconductor device is provided that includes a substrate including a plurality of active regions that may extend longitudinally in a direction and an isolation region that may electrically isolate the plurality of active regions from each other. The semiconductor device may include a first gate trench and a second gate trench that each extend across the plurality of active regions and the isolation region. The first gate trench may be adjacent the second gate trench. The semiconductor device may include a first gate structure and a second gate structure that extend in the first gate trench and the second gate trench, respectively. The semiconductor device may include a first gate dielectric layer that is between the first gate trench and the first gate structure, in the plurality of active regions. The semiconductor device may include a second gate dielectric layer that is between the second gate trench and the second gate structure, in the plurality of active regions. Moreover, a distance between the first gate structure and the second gate structure in the direction may vary based on a longitudinal position of each of the first and second gate structures.

According to some embodiments of the present inventive concepts, a method of manufacturing a semiconductor device is provided. The method may include forming a plurality of active regions that extend longitudinally in a direction and an isolation region that electrically isolates the plurality of active regions from each other, on a substrate. The method may include forming a gate trench that extends across the plurality of active regions and the isolation region. The method may include enlarging the gate trench in each of the plurality of active regions. The method may include forming a gate dielectric layer on an inner surface of the gate trench in each of the plurality of active regions. Moreover, the method may include forming a gate structure in the gate trench.

BRIEF DESCRIPTION OF THE DRAWINGS

Embodiments of the present inventive concepts will be more clearly understood from the following detailed description taken in conjunction with the accompanying drawings in which.

DETAILED DESCRIPTION

Figure 1:
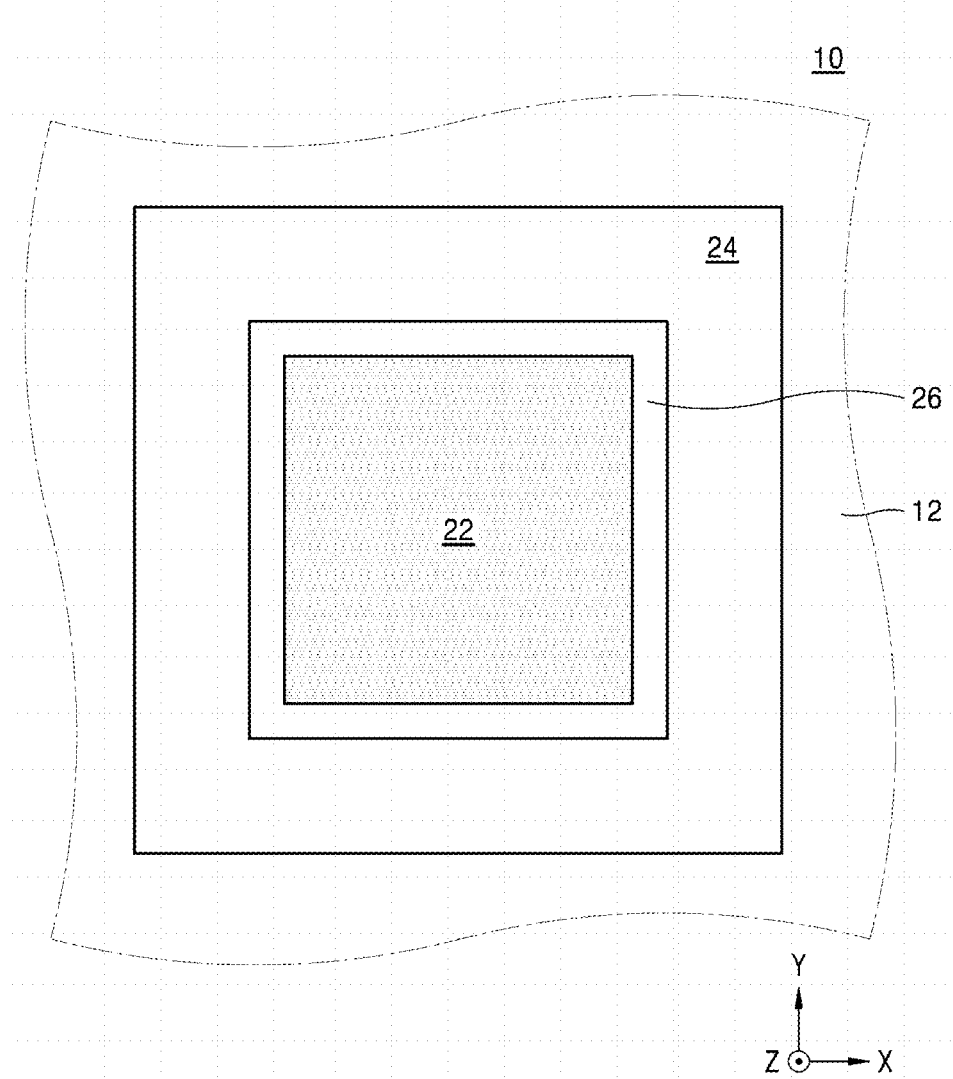
FIG. 1 is a plan view illustrating a schematic configuration of an integrated circuit device according to some embodiments.

Hereinafter, example embodiments will be described in detail with reference to the accompanying drawings. Like reference numerals refer to like elements, and their repetitive descriptions may be omitted.

FIG. 1 is a plan view illustrating a schematic configuration of an integrated circuit device 10 according to some embodiments.

The integrated circuit device 10 may include a first region 22, a second region 24 surrounding the first region 22, and a substrate 12 including an interface region 26 disposed between the first region 22 and the second region 24.

The substrate 12 may include, for example, a semiconductor material such as silicon (Si) or germanium (Ge), or may include at least one compound semiconductor selected from among SiGe, silicon carbide (SiC), gallium arsenide (GaAs), indium arsenide (InAs), and indium phosphide (InP). The substrate 12 may include a conductive region (for example, an impurity-doped well or an impurity-doped structure).

In some embodiments, the first region 22 may be a memory cell region of the integrated circuit device 10. In some embodiments, the first region 22 may be a memory cell region of dynamic random access memory (DRAM). The first region 22 may include a unit memory cell including a transistor and a capacitor or a unit memory cell including a switching element and a variable resistor.

The second region 24 may be a core region or a peripheral circuit region. Peripheral circuits used for driving memory cells of the first region 22 may be disposed in the second region 24.

A plurality of conductive lines, which are installed to enable an electrical connection between the first region 22 and the second region 24, and a plurality of insulation structures for insulating the first region 22 from the second region 24 may be disposed in the interface region 26.

Figure 2:
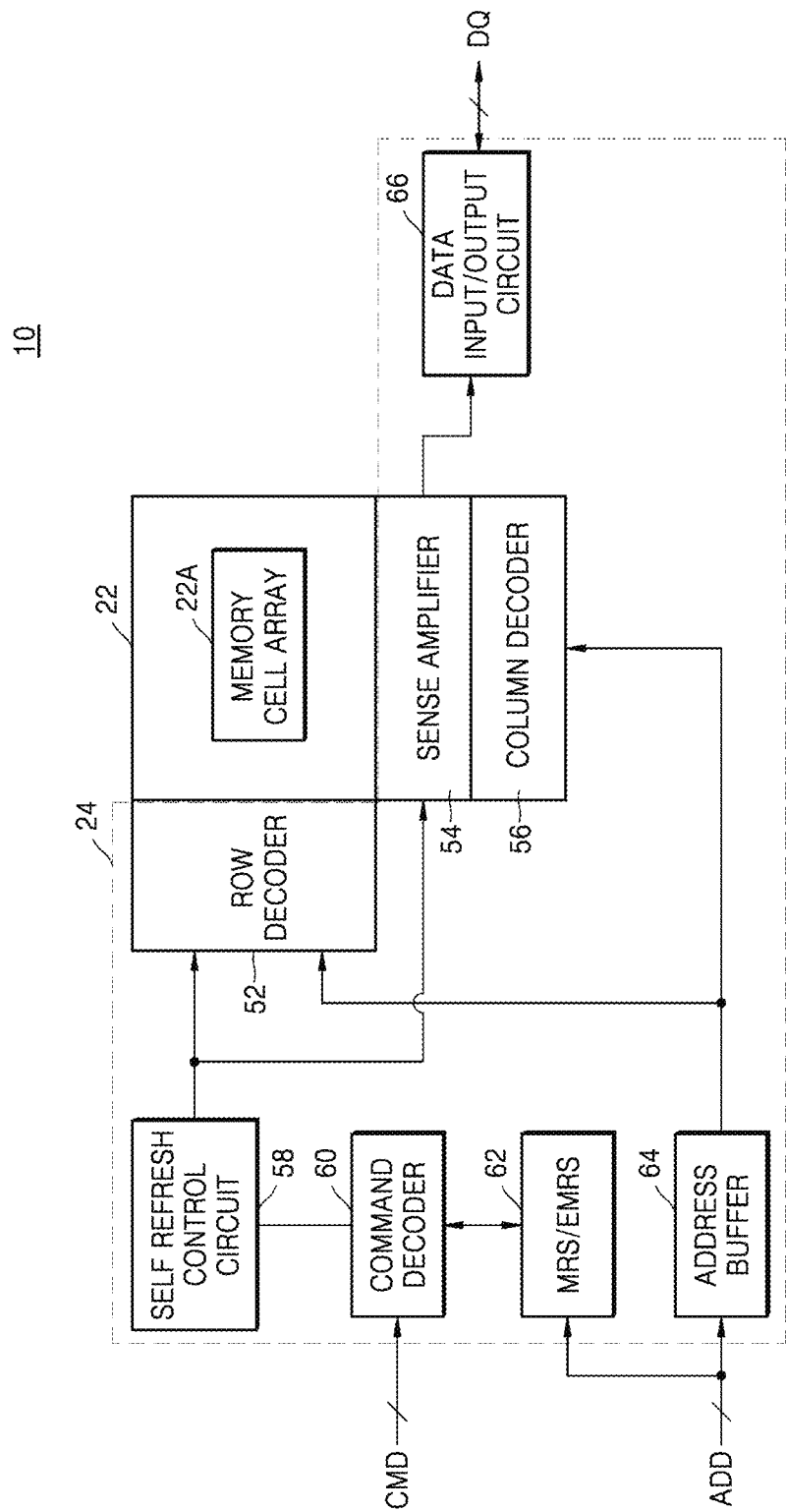
FIG. 2 is a block diagram for describing an example configuration of an integrated circuit device including dynamic random access memory (DRAM)

FIG. 2 is a block diagram for describing an example configuration of an integrated circuit device including DRAM.

Referring to FIG. 2, in the integrated circuit device 10, the first region 22 may be a memory cell region of the DRAM, and the second region 24 may be a peripheral circuit region of the DRAM. The first region 22 may include a memory cell array 22A. In the memory cell array 22A, a plurality of memory cells for storing data may be arranged in a row direction and a column direction. The plurality of memory cells may each include a cell capacitor and an access transistor. A gate of the access transistor may be connected to a corresponding word line of a plurality of word lines arranged in the row direction, one of a source and a drain of the access transistor may be connected to a complementary bit line or a bit line arranged in the column direction, and the other of the source and the drain may be connected to the cell capacitor.

The second region 24 may include a row decoder 52, a sense amplifier 54, a column decoder 56, a self-refresh control circuit 58, a command decoder 60, a mode register set/extended mode register set (MRS/EMRS) circuit 62, an address buffer 64, and a data input/output circuit 66.

The sense amplifier 54 may sense and amplify data of a memory cell and may store amplified data in the memory cell. The sense amplifier 54 may be implemented as a cross-coupled amplifier connected between a bit line and a complementary bit line each included in the memory cell array 22A.

Data DQ input through the data input/output circuit 66 may be written in the memory cell array 22A, based on an address signal ADD. The data DQ, which is read from the memory cell array 22A on the basis of the address signal ADD, may be output to a destination outside of the integrated circuit device 10 through the data input/output circuit 66. The address signal ADD may be input to the address buffer 64, for designating a memory cell which data is to be written in or read from. The address buffer 64 may temporarily store the address signal ADD input from a source outside of the integrated circuit device 10.

The row decoder 52 may decode a row address included in the address signal ADD output from the address buffer 64, for designating a word line connected to a memory cell which data is to be input to or output from. That is, in a data write or read mode, the row decoder 52 may decode the row address output from the address buffer 64 to enable a corresponding word line. Also, in a self-refresh mode, the row decoder 52 may decode a row address generated from an address counter to enable a corresponding word line.

The column decoder 56 may decode a column address included in the address signal ADD output from the address buffer 64, for designating a bit line connected to the memory cell which data is to be input to or output from. The memory cell array 22A may output data from the memory cell designated by the row address and the column address, or may write data in the memory cell.

The command decoder 60 may receive a command signal CMD applied from a source outside of the integrated circuit device 10 and may decode the command signal CMD to internally generate a decoded command signal (for example, a self-refresh entry command or a self-refresh exit command).

The MRS/EMRS circuit 62 may set an internal mode register in response to an MRS/EMRS command and the address signal ADD for designating an operation mode of the integrated circuit device 10.

In some embodiments, the integrated circuit device 10 may further include a clock circuit for generating a clock signal and a power circuit which receives a source voltage applied from a source outside of the integrated circuit device 10 to generate or divide an internal voltage.

The self-refresh control circuit 58 may control a self-refresh operation of the integrated circuit device 10 in response to a command output from the command decoder 60. The command decoder 60 may include an address counter, a timer, and a core voltage generator. In response to a self-refresh entry command output from the command decoder 60, the address counter may generate a row address signal for designating a row address which is to be self-refreshed and may apply the generated row address signal to the row decoder 52. The address counter may end a counting operation in response to a self-refresh exit command output from the command decoder 60.

Figure 3:
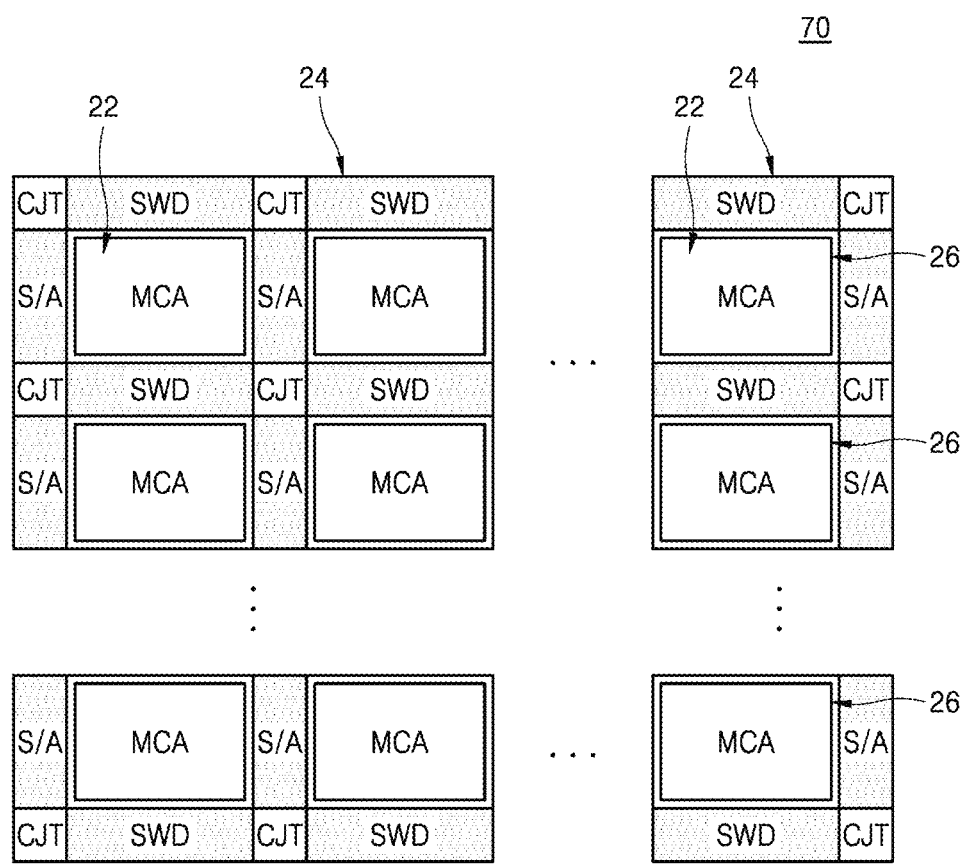
FIG. 3 is a plan view illustrating a schematic configuration of an integrated circuit device according to some embodiments.

FIG. 3 is a plan view illustrating a schematic configuration of an integrated circuit device 70 according to some embodiments. In FIGS. 1 and 3, like reference numerals refer to like elements, and thus, their detailed description may be omitted in FIG. 3.

Referring to FIG. 3, the integrated circuit device 70 may include a plurality of first regions 22. Each of the plurality of first regions 22 may be surrounded by a second region 24 with an interface region 26 therebetween. In the integrated circuit device 70, each of the plurality of first regions 22 may be a memory cell array region MCA of DRAM, and the second region 24 may be a peripheral circuit region of the DRAM.

In the plurality of first regions 22, the memory cell array region MCA may include the memory cell array 22A described above with reference to FIG. 2. Each of the plurality of first regions 22 may be surrounded by the interface region 26.

The second region 24 may include a sub-word line driver block SWD, a sense amplifier block S/A, and a conjunction block CJT. In the second region 24, a plurality of sub-word line driver blocks SWD may be arranged in a word line direction of the memory cell array region MCA, and a plurality of sense amplifier blocks S/A may be arranged in a bit line direction of the memory cell array region MCA. A plurality of bit line sensor amplifiers may be provided in each of the sense amplifier blocks S/A. The conjunction block CJT may be provided at a point at which each of the sub-word line driver blocks SWD intersects with a corresponding sense amplifier block S/A. A plurality of power drivers and a plurality of ground drivers for driving the bit line sense amplifiers may be alternately arranged in the conjunction block CJT.

In some embodiments, peripheral circuits such as an input/output circuit and an inverter chain may be further provided in the second region 24.

Figure 4:
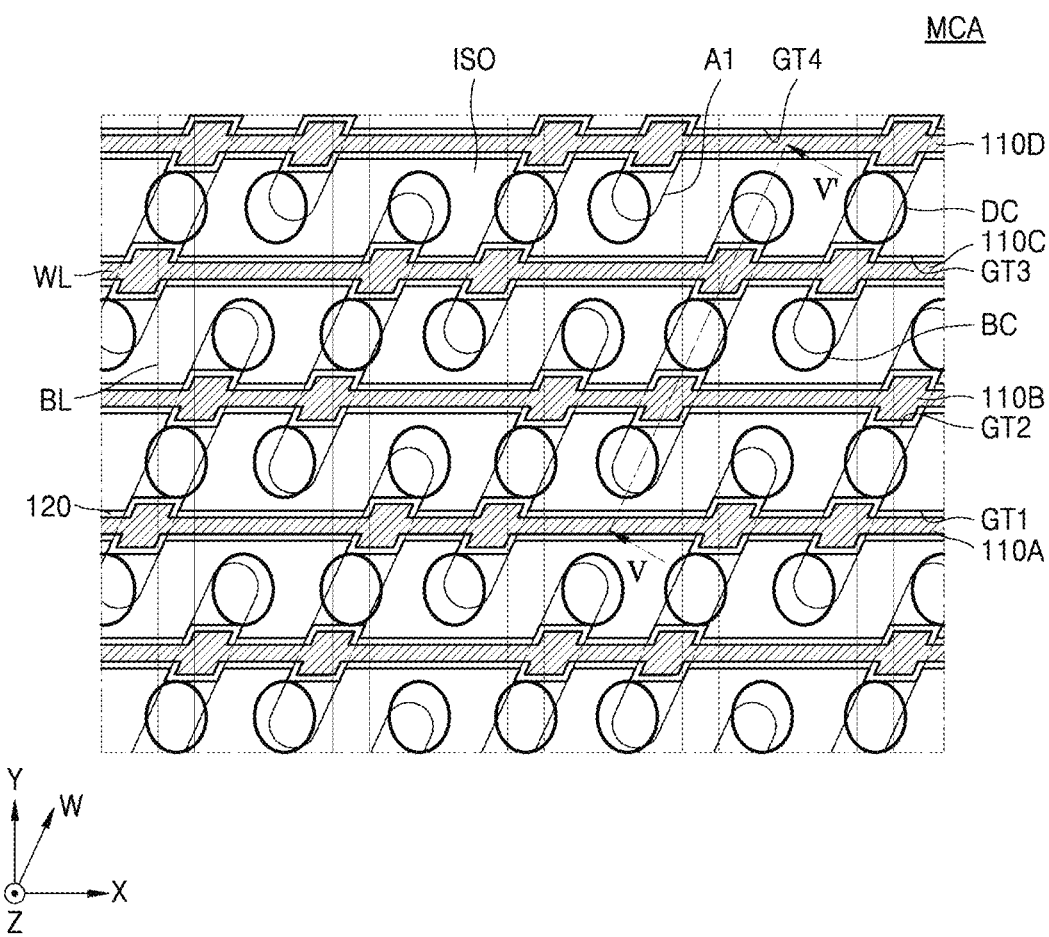
FIG. 4 is a plan layout for describing main elements of a memory cell array region illustrated in FIG. 3.

FIG. 4 is a plan layout for describing main elements of the memory cell array region MCA illustrated in FIG. 3.

Referring to FIG. 4, the memory cell array region MCA may include a plurality of active regions A1. The plurality of active regions A1 may be disposed to include a long axis extending (i.e., extending longitudinally) in a first direction (a W-axis direction). Some of the plurality of active regions A1 may be arranged in one row in a second direction (an X-axis direction) that intersects the first direction (the W-axis direction). Others of the plurality of active regions A1 may be arranged in one row in a third direction (a Y-axis direction).

A plurality of word lines WL may extend in parallel in the second direction (the X-axis direction) across the plurality of active regions A1. A plurality of bit lines BL may be disposed on the plurality of word lines WL and may extend in parallel in the third direction (the Y-axis direction) intersecting with the second direction (the X-axis direction). Each of the plurality of bit lines BL may be connected to a corresponding active region A1 through a direction contact DC.

A plurality of buried contacts BC may be provided between two adjacent bit lines BL of the plurality of bit lines BL. The plurality of buried contacts BC may approximately be arranged in one row in the second direction (the X-axis direction) and the third direction (the Y-axis direction). In some embodiments, a plurality of landing pads may be provided on the plurality of buried contacts BC. Each of the plurality of buried pads BC and a corresponding landing pad may connect a bottom electrode of a capacitor, provided on a corresponding bit line BL, to a corresponding active region A1. Each of the plurality of landing pads may be disposed to partially overlap a corresponding buried contact BC.

Figure 5:
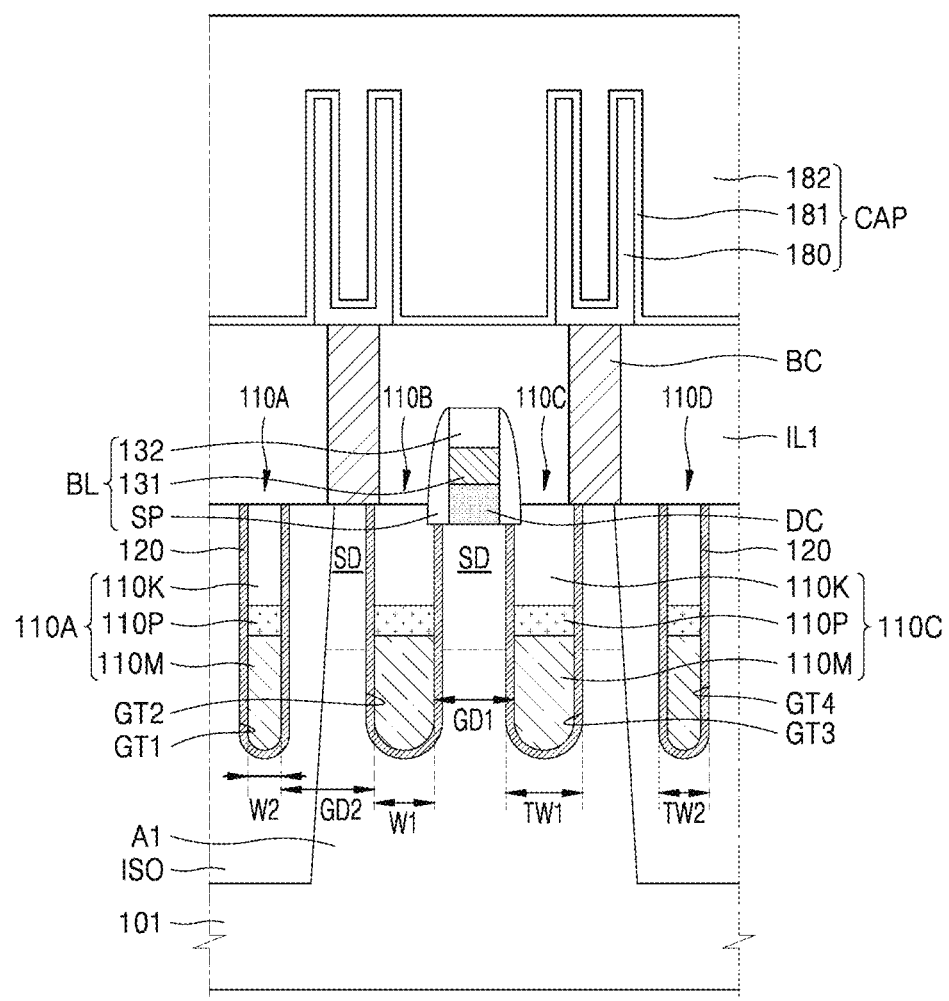
FIG. 5 is a diagram for describing main elements of a semiconductor device according to some embodiments, FIG. 5 being a cross-sectional view illustrating some elements of a cross-sectional surface taken along line V-V' of FIG. 4.

FIG. 5 is a diagram for describing main elements of a semiconductor device according to some embodiments, FIG. 5 being a cross-sectional view illustrating some elements of a cross-sectional surface taken along line V-V' of FIG. 4.

Referring to FIGS. 4 and 5, a substrate 101 may be provided, and the substrate 101 may include a plurality of active regions A1 and an isolation region ISO which electrically isolates the plurality of active regions A1.

The substrate 101 may include a bulk silicon substrate, a silicon on insulator (SOI) substrate, a germanium substrate, a germanium on insulator (GOI) substrate, a silicon germanium substrate, or an epitaxial thin film substrate obtained by performing selective epitaxial growth (SEG).

Each of the active regions A1 of the substrate 101 may have a bar shape, and a long axis of each of the active regions A1 may extend in a first direction (a W-axis direction) which is a diagonal direction with respect to an extension direction of a plurality of word lines WL and a plurality of bit lines BL.

The isolation region ISO may surround the plurality of active regions A1 and may electrically isolate the plurality of active regions A1 from each other. The isolation region ISO may include high-density plasma (HDP) oxide, tetraethyl orthosilicate (TEOS), plasma enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG), tonen silazene (TOSZ), or a combination thereof.

A plurality of gate trenches (for example, first to fourth gate trenches) GT1 to GT4 may be provided to extend across the plurality of active regions A1 and the isolation region ISO. The plurality of gate trenches GT1 to GT4 may extend in a lengthwise direction thereof and may alternately pass through the plurality of active regions A1 and the isolation region ISO. As illustrated in FIG. 4, the plurality of gate trenches GT1 to GT4 may have different widths in the first direction (the W-axis direction) by extending in the lengthwise direction thereof and alternately passing through the plurality of active regions A1 and the isolation region ISO.

In FIG. 5, the first gate trench GT1 and the fourth gate trench GT4 may pass through the isolation region ISO, and the second gate trench GT2 and the third gate trench GT3 may pass through a corresponding active region A1. However, it may be understood by those of ordinary skill in the art that, in a process of extending the first to fourth gate trenches GT1 to GT4, the first gate trench GT1 and the fourth gate trench GT4 may simultaneously or independently pass through the corresponding active region A1, based on a longitudinal position thereof, and the second gate trench GT2 and the third gate trench GT3 may simultaneously or independently pass through the isolation region ISO, based on the longitudinal position thereof.

The second gate trench GT2 and the third gate trench GT3 may pass through the corresponding active region A1 to have a first trench width TW1 in the first direction (the W-axis direction). Also, the first gate trench GT1 and the fourth gate trench GT4 may pass through the isolation region ISO to have a second trench width TW2 in the first direction (the W-axis direction).

The first trench width TW1 may be greater than the second trench width TW2. In some embodiments, the first trench width TW1 may be about 100% to about 140% (or about 110% to about 140%) of the second trench width TW2.

If instead the second trench width TW2 is too much narrower than the first trench width TW1 (e.g., if the first trench width TW1 is significantly greater than about 140% of the second trench width TW2), resistances of a plurality of gate structures (for example, first to fourth gate structures) 110A to 110D respectively provided in the gate trenches GT1 to GT4 may increase, causing a reduction in performance of the semiconductor device.

Moreover, when the second trench width TW2 has a size which is the same as or similar to the first trench width TW1, electrical interference between the gate structures 110A to 110D respectively provided in the gate trenches GT1 to GT4 may increase, causing a reduction in reliability of the semiconductor device.

In each of the active regions A1, a gate dielectric layer 120 may be provided on an inner surface of each of the gate trenches GT1 to GT4. The gate dielectric layer 120 may include silicon oxide, silicon oxynitride, an oxide/nitride/oxide (ONO) film, or a high-k dielectric film having a dielectric constant which is higher than that of silicon oxide. The high-k dielectric film may have a dielectric constant of about 10 to about 25, and for example, may include hafnium oxide ($HfO_2$), aluminum oxide ($Al_2O_3$), hafnium aluminum oxide ($HfAlO_3$), tantalum oxide ($Ta_2O_3$), or titanium oxide ($TiO_2$).

In some embodiments, at least a portion of the gate dielectric film 120 may be obtained by thermally oxidizing each of the active regions A1. However, the present inventive concepts are not limited thereto.

In a case where the gate dielectric layer 120 is formed by deposition, the gate dielectric layer 120 may be provided on the inner surface of each of the gate trenches GT1 to GT4 in the isolation region ISO.

The gate structures 110A to 110D may be respectively provided in the gate trenches GT1 to GT4. Each of the gate structures 110A to 110D may include a lower gate line 110M, an upper gate line 110P, and a capping layer 110K covering the upper gate line 110P.

The lower gate line 110M may include, for example, conductive metal or conductive nitride thereof. In some embodiments, the lower gate line 110M may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof. However, the present inventive concepts are not limited thereto.

The upper gate line 110P may include, for example, doped polysilicon. However, the present inventive concepts are not limited thereto.

The capping layer 110K may include silicon nitride, silicon oxynitride, silicon oxide, or a combination thereof.

Each of the gate structures 110A to 110D may extend across the plurality of active regions A1 and the isolation region ISO. Each of the gate structures 110A to 110D may extend in a lengthwise direction thereof and may alternately pass through the plurality of active regions A1 and the isolation region ISO. As illustrated in FIG. 4, the plurality of gate structures 110A to 110D may have different widths in the first direction (the W-axis direction) by extending in the lengthwise direction thereof and alternately passing through the plurality of active regions A1 and the isolation region ISO.

In FIG. 5, the first gate structure 110A and the fourth gate structure 110D may pass through the isolation region ISO, and the second gate structure 110B and the third gate structure 110C may pass through the active regions A1. However, it may be understood by those of ordinary skill in the art that, in a process of extending the first to fourth structures 110A to 110D, the first gate structure 110A and the fourth gate structure 110D may simultaneously or independently pass through the corresponding active region A1, based on a longitudinal position thereof, and the second gate structure 110B and the third gate structure 110C may simultaneously or independently pass through the isolation region ISO, based on a longitudinal position thereof.

The second gate structure 110B and the third gate structure 110C may pass through the corresponding active region A1 to have a first width W1 in the first direction (the W-axis direction). Also, the first gate structure 110A and the fourth gate structure 110D may pass through the isolation region ISO to have a second width W2 in the first direction (the W-axis direction).

The first width W1 may be greater than the second width W2. In some embodiments, the first width W1 may be about 110% to about 140% of the second width W2.

If instead the second width W2 is too much narrower than the first width W1 (e.g., if the first width W1 is significantly greater than about 140% of the second width W2), resistances of the plurality of gate structures 110A to 110D may increase, causing a reduction in performance of the semiconductor device.

Moreover, when the second width W2 has a size which is the same as or similar to the first width W1, electrical interference between the gate structures 110A to 110D may increase, causing a reduction in reliability of the semiconductor device.

Two gate structures (for example, the second gate structure 110B and the third gate structure 110C each illustrated in FIG. 5) passing through a common active region A1 may be separated from each other by a first distance GD1. Also, a gate structure passing through the common active region A1 and another gate structure which does not pass through the common active region A1 in adjacency thereto, (for example, the second gate structure 110B and the first gate structure 110A each illustrated in FIG. 5), may be separated from each other by a second distance GD2. In some embodiments, the first distance GD1 may be less than the second distance GD2.

As the size of the semiconductor device decreases, a current of a conductive line which passes by the semiconductor device in adjacency to the semiconductor device may affect an operation of the semiconductor device, and thus, a distance between the semiconductor device and a conductive line passing by the semiconductor device may be largely reduced, thereby possibly reducing device reliability. In the example of FIGS. 4 and 5, a distance (for example, the second distance GD2) to a gate structure passing through the isolation region ISO may be greater than a distance (for example, the first distance GD1) between two gate structures in each of the active regions A1, and thus, a possibility of electrical interference between gate structures may be reduced, thereby enhancing device reliability.

In some embodiments, lower ends of the gate trenches GT1 to GT4 may be disposed on substantially the same level.

A plurality of source/drain regions SD may be provided near upper surfaces of the plurality of active regions A1.

Also, in the corresponding active region A1, a bit line BL may extend in a direction differing from the first direction (the W-axis direction). In some embodiments, the bit line BL may extend in the third direction (the Y-axis direction) crossing the second direction (the X-axis direction) in which a word line WL (i.e., gate structures) extends. Accordingly, the gate structures 110A-110D may comprise respective word lines WL, which may each have a first portion in one or more active regions A1 that is wider, in the first direction (the W-axis direction), than a second portion in an isolation region ISO.

The bit line BL may be connected to the corresponding active region A1 through a direct contact DC.

The direct contact DC may include a contact semiconductor layer. In some embodiments, the contact semiconductor layer may include polysilicon doped with a P-type dopant or an N-type dopant. For example, the direct contact DC may include a polysilicon layer doped at a doping concentration selected within a range of about $1 \times 10^{20}$ cm$^{-3}$ to about $9 \times 10^{20}$ cm$^{-3}$.

The bit line BL may include a first conductive layer 131, a second conductive layer 132 disposed on the first conductive layer 131, and a spacer SP covering a side surface of each of the first and second conductive layers 131 and 132.

The first conductive layer 131 may include a semiconductor layer and may contact an upper surface of the direct contact DC. The first conductive layer 131 may have a doping concentration which is higher than that of a contact semiconductor layer of the direct contact DC. In some embodiments, the first conductive layer 131 may include polysilicon doped with a P-type dopant or an N-type dopant. The first conductive layer 131 may be doped with a dopant having the same conductive type as that of a dopant included in the direct contact DC. For example, the first conductive layer 131 may include a polysilicon layer doped at a doping concentration selected within a range of about $2 \times 10^{20}$ cm$^{-3}$ to about $9 \times 10^{21}$ cm$^{-3}$.

The second conductive layer 132 may include TiSiN, TiN, TaN, cobalt nitride (CoN), metal, metal silicide, or a combination thereof. The metal and the silicide may include tungsten (W), molybdenum (Mo), gold (Au), copper (Cu), aluminum (Al), nickel (Ni), or cobalt (Co). The second conductive layer 132 may include a single layer, or may include two or more layers which are stacked. In some embodiments, the second conductive layer 132 may include a lower layer including TiSiN and an upper layer which includes W and is disposed on the lower layer.

The spacer SP may include oxide, nitride, an air spacer, or a combination thereof. The air spacer may include other gases in air or which occur in a process of manufacturing the semiconductor device.

The corresponding active region A1 may be connected to a capacitor CAP through a buried contact BC.

The buried contact BC may include a conductive material, and for example, may include at least one of doped polysilicon, a metal material, and conductive metal nitride. For example, the buried contact BC may include W and tungsten nitride ($W_xN_{1-x}$).

The buried contact BC may be provided in an interlayer insulation layer IL1. The interlayer insulation layer IL1 may include, for example, a silicon oxide film which is formed by a chemical vapor deposition (CVD) process.

The capacitor CAP may include a bottom electrode 180, a dielectric layer 181, and a top electrode 182.

The bottom electrode 180 and the top electrode 182 may each include at least one of an impurity-doped semiconductor material (for example, doped polysilicon), conductive metal nitride (for example, titanium nitride, tantalum nitride, or tungsten nitride), metal (for example, ruthenium, iridium, titanium, or tantalum), and a conductive metal compound (for example, oxide iridium).

The dielectric layer 181 may include a single layer including a material selected from among metal oxide (for example, $HfO_2$, zirconium oxide ($ZrO_2$), $Al_2O_3$, lanthanum oxide ($La_2O_3$), $Ta_2O_3$, or $TiO_2$) and a dielectric material (for example, strontium titanate ($SrTiO_3$ (STO)), barium strontium titanate ($(Ba,Sr)TiO_3$ (BST)), $BaTiO_3$, lead zirconate titanate (PZT), or lead lanthanum zirconium titanate (PLZT)) having a Perovskite structure, or may include a combination thereof.

Figure 6:
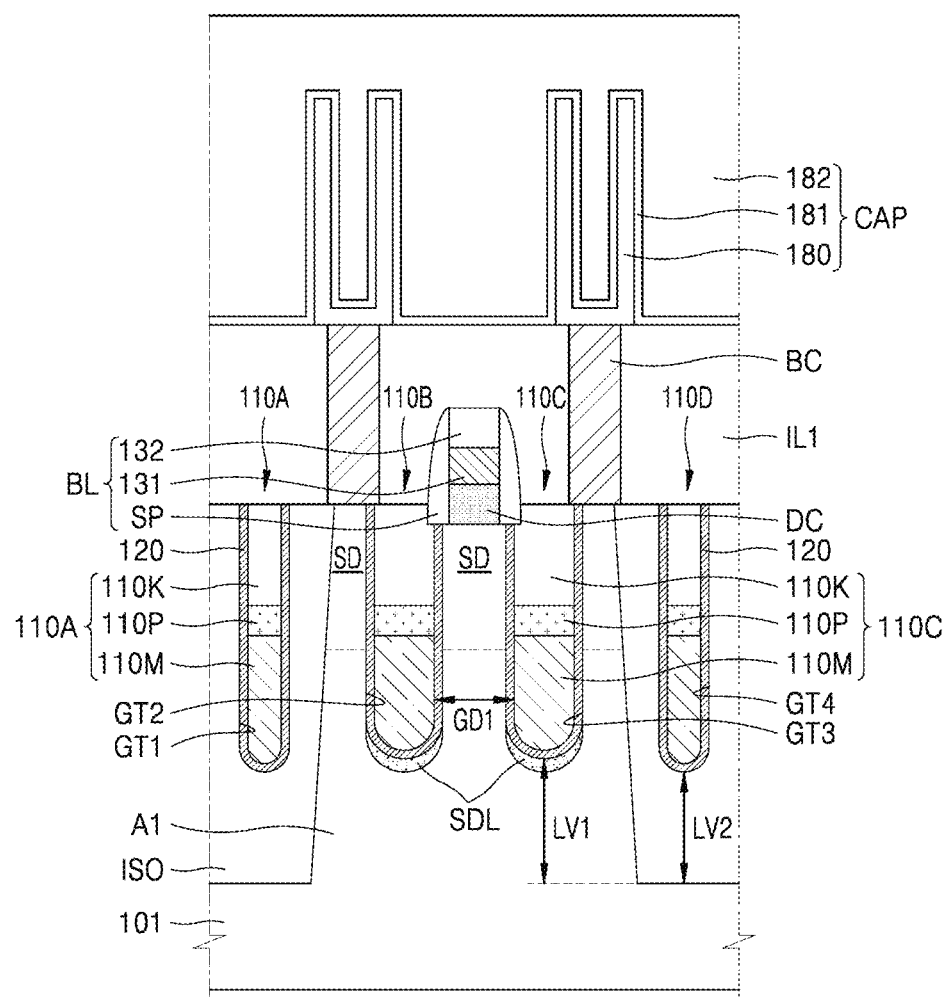
FIG. 6 is a diagram for describing main elements of a semiconductor device according to some embodiments.

FIG. 6 is a diagram for describing main elements of a semiconductor device according to some embodiments. FIG. 6 may correspond to a cross-sectional surface taken along line V-V' of FIG. 4.

The semiconductor device illustrated in FIG. 6 may have a difference with the semiconductor device illustrated in FIG. 5 in terms of second and third gate structures 110B and 110C and a level of a lower end of each of first and fourth gate trenches GT1 and GT4 that contacts an active region A1. Hereinafter, therefore, the difference(s) will be mainly described, and repeated descriptions of elements of FIG. 6 and elements of FIG. 5 may be omitted.

In the active region A1, a gate trench (for example, a second gate trench GT2 or a third gate trench GT3 in FIG. 6) may have a first level LV1 with respect to a floor surface of an isolation region ISO. Also, a gate trench (for example, the first gate trench GT1 or the fourth gate trench GT4 in FIG. 6) in an isolation region ISO may have a second level LV2 with respect to a floor surface of the isolation region ISO. The second level LV2 may be lower than the first level LV1. In other words, a depth of the first gate trench GT1 or the fourth gate trench GT4 passing through the isolation region ISO may be deeper than that of the second gate trench GT2 or the third gate trench GT3 passing through the active region A1.

This may be because the second gate structure 110B or the third gate structure 110C passing through the active region A1 partially surrounds the active region A1, contacts a sidewall contact portion SDL, and passes through the active region A1.

Figure 7:
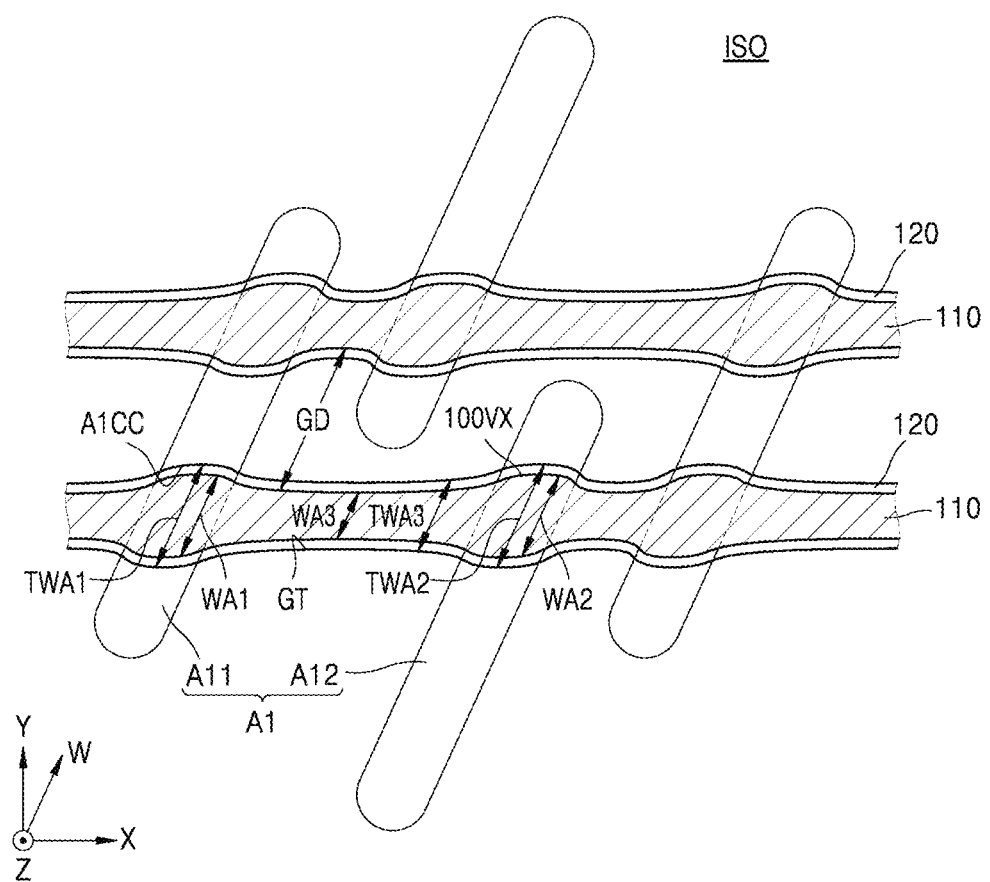
FIG. 7 is a plan view illustrating a plurality of active regions and a gate structure in a semiconductor device according to some embodiments.

FIG. 7 is a plan view illustrating a plurality of active regions A1 and a gate structure 110 in a semiconductor device according to some embodiments.

Referring to FIG. 7, the gate structure 110 may extend in a second direction (an X-axis direction) across the plurality of active regions A1. The gate structure 110 illustrated in FIG. 7 may have a curved side profile unlike FIG. 4 where each gate structure has a rectilinear side profile.

Particularly, the gate structure 110 may have a side profile 110VX which convexly protrudes in an active region A1. In some embodiments, a width of the gate structure 110 in a first direction (a W-axis direction) may be reduced in a direction away from the active region A1. In some embodiments, a width of the gate structure 110 in the first direction may have its highest value in the active region A1.

The gate structure 110 may have a first average width WA1 in the first direction (the W-axis direction) in a first active region A11 of the active region A1, and the width of the gate structure 110 in the first direction may gradually vary in embodiments where the gate structure 110 extends toward a second active region A12 of the active region A1 in a lengthwise direction thereof. In some embodiments, the width of the gate structure 110 in the first direction may gradually decrease in embodiments where the gate structure 110 extends from the first active region A11 to the second active region A12 in the lengthwise direction thereof. Here, "a gradual reduction" in width of the gate structure 110 in the first direction may not denote that the width of the gate structure 110 in the first direction is gradually reduced with respect to a total length between the first active region A11 and the second active region A12.

The width of the gate structure 110 in the first direction may decrease by a certain size from the first active region A11, and then, may again increase as the gate structure 110 becomes closer to the second active region A12. In some embodiments, a reduction and an increase in width of the gate structure 110 in the first direction may be repeated once or more between the first active region A11 and the second active region A12.

Moreover, the gate structure 110 may have a second average width WA2 in the first direction in the second active region A12, and the width of the gate structure 110 in the first direction may gradually vary in embodiments where the gate structure 110 extends toward the first active region A11 in the lengthwise direction thereof. The first average width WA1 may be the same as or different from the second average width WA2.

The gate structure 110 may have a third average width WA3 in an isolation region ISO. The first average width WA1 may be about 110% to about 140% of the third average width WA3. If instead the first average width WA1 is too much greater than (e.g., substantially higher than 140% of) the third average width WA3, an electrical resistance may excessively increase, and due to this, device performance may be reduced. On the other hand, when the first average width WA1 is the same as or similar to the third average width WA3, electrical interference between two adjacent gate structures 110 may increase, and due to this, the reliability of the semiconductor device may be reduced.

Moreover, two adjacent gate structures 110 may be separated from each other by a first distance GD in the first direction, and the first distance GD may gradually vary based on positions of the two adjacent gate structures 110 in a lengthwise direction. As used herein with respect to two gate trenches GT (or two gate structures 110), the term "adjacent" means that no other gate trench GT (or no other gate structure 110) intervenes therebetween.

Referring again to FIG. 7, a gate trench GT may extend in the second direction (the X-axis direction) across the plurality of active regions A1. The gate trench GT illustrated in FIG. 7 may have a curved side profile unlike FIG. 4 where each gate trench has a rectilinear side profile.

The gate trench GT may have a first trench average width TWA1 in the first direction (the W-axis direction) in the first active region A11, and a width of the gate trench GT in the first direction may gradually vary in embodiments where the gate trench GT extends toward the second active region A12 in a lengthwise direction thereof. In some embodiments, the width of the gate trench GT in the first direction may gradually decrease in embodiments where the gate trench GT extends from the first active region A11 to the second active region A12 in the lengthwise direction thereof. Here, "a gradual reduction" in width of the gate trench GT in the first direction may not denote that the width of the gate trench GT in the first direction is gradually reduced with respect to the total length between the first active region A11 and the second active region A12.

The width of the gate trench GT in the first direction may decrease by a certain size from the first active region A11, and then, may again increase as the gate trench GT becomes closer to the second active region A12. In some embodiments, a reduction and an increase in width of the gate trench GT in the first direction may be repeated once or more between the first active region A11 and the second active region A12.

Moreover, the gate trench GT may have a second trench average width TWA2 in the first direction in the second active region A12, and the width of the gate trench GT in the first direction may gradually vary in embodiments where the gate trench GT extends toward the first active region A11 in the lengthwise direction thereof. The first trench average width TWA1 may be the same as or different from the second trench average width TWA2.

The gate trench GT may have a third trench average width TWA3 in the isolation region ISO. The first trench average width TWA1 may be about 110% to about 140% of the third trench average width TWA3. If instead the first trench average width TWA1 is too much greater than (e.g., substantially higher than 140% of) the third trench average width TWA3, an electrical resistance may excessively increase, and due to this, device performance may be reduced. On the other hand, when the first trench average width TWA1 is the same as or similar to the third trench average width TWA3, electrical interference between two adjacent gate structures 110 may increase, and due to this, the reliability of the semiconductor device may be reduced.

In some embodiments, in the active region A1, a concave portion of the gate trench GT may correspond to a convex portion A1 CC of the gate structure 110. That is, in the active region A1, the gate structure 110 may have a convex shape, based on a concave shape of the gate trench GT. In this case, a gate dielectric layer 120 may be disposed between the gate structure 110 and the gate trench GT.

Figure 8:
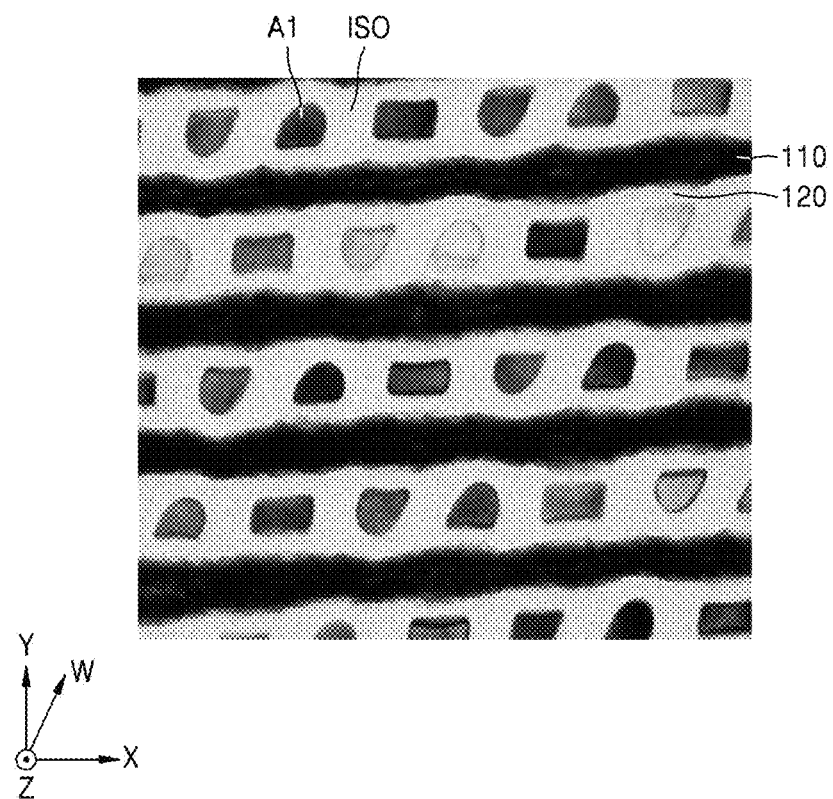
FIG. 8 is an image obtained by photographing a semiconductor device, manufactured according to some embodiments, with a scanning electron microscope (SEM)

FIG. 8 is an image obtained by photographing a semiconductor device manufactured according to some embodiments with a scanning electron microscope (SEM).

Referring to FIG. 8, a plurality of active regions A1 may be arranged in an isolation region ISO similarly to the arrangement illustrated in FIG. 4. Also, a plurality of gate structures 110 may extend in a second direction (an X-axis direction) across the plurality of active regions A1. A width of each of the gate structures 110 may not be constant and may vary, based on a longitudinal position thereof. Particularly, each of the gate structures 110 may have a wider width in a portion overlapping the active regions A1 and may have a narrower width in the isolation region ISO.

Moreover, it may be seen that the width of each of the gate structures 110 gradually varies based on the longitudinal position thereof.

FIGS. 9A to 9D are side cross-sectional views illustrating a method of manufacturing a semiconductor device, according to some embodiments.

Figure 9A:
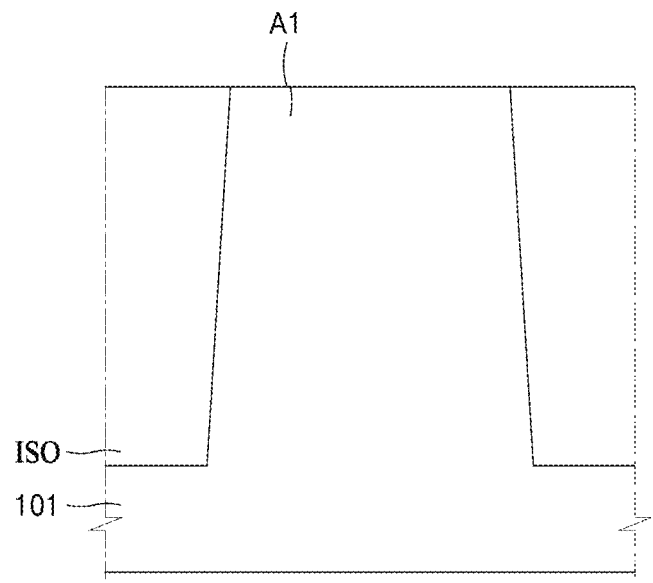
FIGS. 9A to 9D are side cross-sectional views illustrating a method of manufacturing a semiconductor device, according to some embodiments.

Referring to FIG. 9A, an active region A1 and an isolation region ISO may be defined on a substrate 101. The isolation region ISO and the substrate 101 including the active region A1 have been described above with reference to FIG. 5, and thus, repetition of their detailed descriptions may be omitted.

A recess may be formed in the substrate 101, for forming the isolation region ISO. A mask pattern may be formed, and then, the recess may be formed by performing an anisotropic etching process. Subsequently, a gap-fill oxide layer may be formed and planarized in the recess. The gap-fill oxide layer may include HDP oxide, TEOS, PE-TEOS, $O_3$-TEOS, USG, PSG, BSG, BPSG, FSG, SOG, TOSZ, or a combination thereof.

Figure 9B:
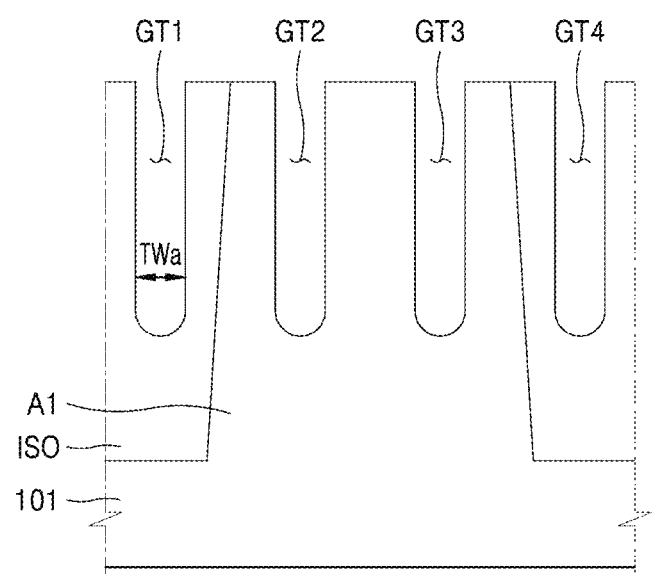

Referring to FIG. 9B, a plurality of gate trenches GT1 to GT4 may be formed to extend in one direction. The gate trenches GT1 to GT4 may be formed by a photolithography process.

The gate trenches GT1 to GT4 may pass through the isolation region ISO and the active region A1 and may extend in the one direction. An extension direction of each of the gate trenches GT1 to GT4 may be vertical to a long-axis direction of the active region A1, or may be diagonally inclined.

The gate trenches GT1 to GT4 may have substantially the same width.

Figure 9C:
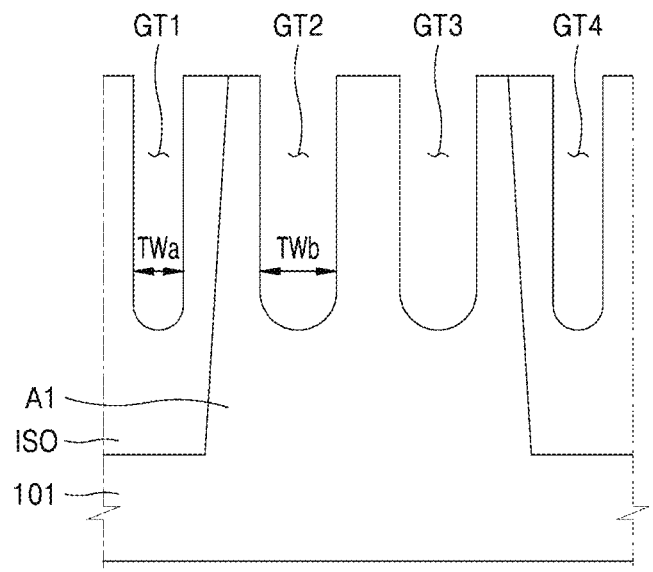

Referring to FIG. 9C, in the active region A1, the gate trenches GT2 and GT3 may be formed/enlarged. The gate trenches GT2 and GT3 may each have an enlarged width.

In order to enlarge the gate trenches GT1 to GT4 in the active region A1, a wet etching process may be performed on the gate trenches GT1 to GT4 in the active region A1. The wet etching process may be performed by using an etchant which does not etch the isolation region ISO or very slowly etches the isolation region ISO and very quickly etches silicon included in the active region A1.

The etchant may be, for example, an etchant which does not etch silicon oxide or very slowly etches silicon oxide and very quickly etches silicon.

In some embodiments, the etchant may be a mixed solution of ammonium hydroxide ($NH_4OH$), oxygenated water ($H_2O_2$), and water ($H_2O$). In some embodiments, the etchant may be a mixed solution of hydrochloric acid (HCl), $H_2O_2$, and $H_2O$. In some embodiments, the etchant may be a mixed solution of sulphuric acid ($H_2SO_4$), $H_2O_2$, and $H_2O$. A content of each component may be adjusted depending on the case.

In some embodiments, the etchant may be, for example, SC1, SC2, ammonium peroxide mixture (APM), sulfuric acid peroxide mixture (SPM), hydrochloric peroxide mixture (HPM), or a combination thereof. However, the etchant is not limited thereto.

In some embodiments, the etchant may contact the active region A1 at a temperature of about 60° C. to about 90° C. for about 1 minute to about 30 minutes.

Figure 10:
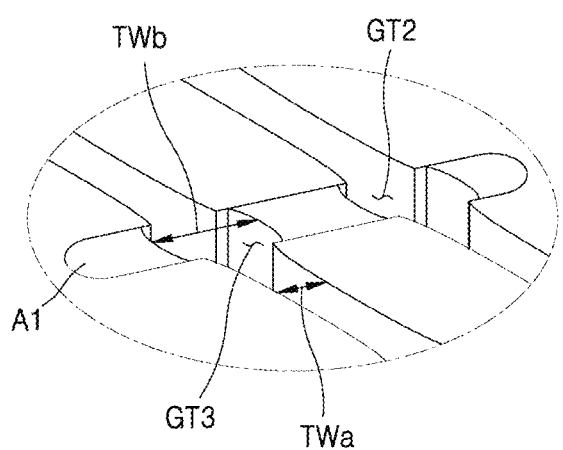
FIG. 10 is a perspective view illustrating an active region enlarged by an etchant.

FIG. 10 is a perspective view illustrating an active region enlarged by an etchant. Referring to FIG. 10, a plurality of gate trenches GT2 and GT3 may pass through an isolation region ISO and an active region A1 buried thereinto and may extend.

The gate trenches GT2 and GT3 may each have a fifth trench width TWa in a portion other than the active region A1 and may each have a sixth trench width TWb which is greater than the fifth trench width TWa.

Particularly, in the active region A1, the gate trenches GT2 and GT3 may each have an inner concave surface. An isotropic etching process using an etchant may be performed based on a chemical reaction. A speed of the chemical reaction may be affected by various variables, and a concentration of a reactant may be one of the various variables.

An exposed sidewall of the active region A1 may be partially and isotropically removed by the etchant. The example shown in FIG. 10 is not limited to a specific theory. The transfer of materials may be smoothly performed in a horizontal-direction center portion of the exposed sidewall of the active region A1, and thus, the concentration of the etchant in the horizontal-direction center portion of the exposed sidewall of the active region A1 may be higher than in a horizontal-direction edge portion of the exposed sidewall of the active region A1, whereby an isotropic etching reaction may be more smoothly performed. Accordingly, more of the horizontal-direction center portion of the exposed sidewall of the active region A1 may be removed, and thus, may have a concave sidewall profile.

As described above, the etchant may be selected from among various materials so that an etching speed difference occurs with respect to the isolation region ISO and the active region A1, and thus, while the active region A1 is being etched, the isolation region ISO may not be etched or may be slightly etched.

The sixth trench width TWb of each of the gate trenches GT2 and GT3 in the active region A1 may be about 110% to about 140% of the fifth trench width TWa of each of the gate trenches GT2 and GT3 in the isolation region ISO. Each of the fifth trench width TWa and the sixth trench width TWb may vary based on a lengthwise direction in the isolation region ISO and the active region A1. In some embodiments, each of the fifth trench width TWa and the sixth trench width TWb may be represented by an average value based on the lengthwise direction in the isolation region ISO and the active region A1.

Referring again to FIG. 9C, the gate trenches GT2 and GT3 of the active region A1 may each have a width which is wider than that of each of the gate trenches GT1 and GT4 passing through the isolation region ISO. A lateral width of each of the gate trenches GT2 and GT3 of the active region A1 may be enlarged by the etchant, and thus, a depth of each of the gate trenches GT2 and GT3 of the active region A1 may be slightly deepened (in a vertical/Z-axis direction).

However, the gate trenches GT1 to GT4 may have a structure having a high aspect ratio, and thus, in comparison with enlargement of a lateral width, an increase in a longitudinal depth may not be large and may very slightly affect a shape of each gate trench.

Figure 9D:
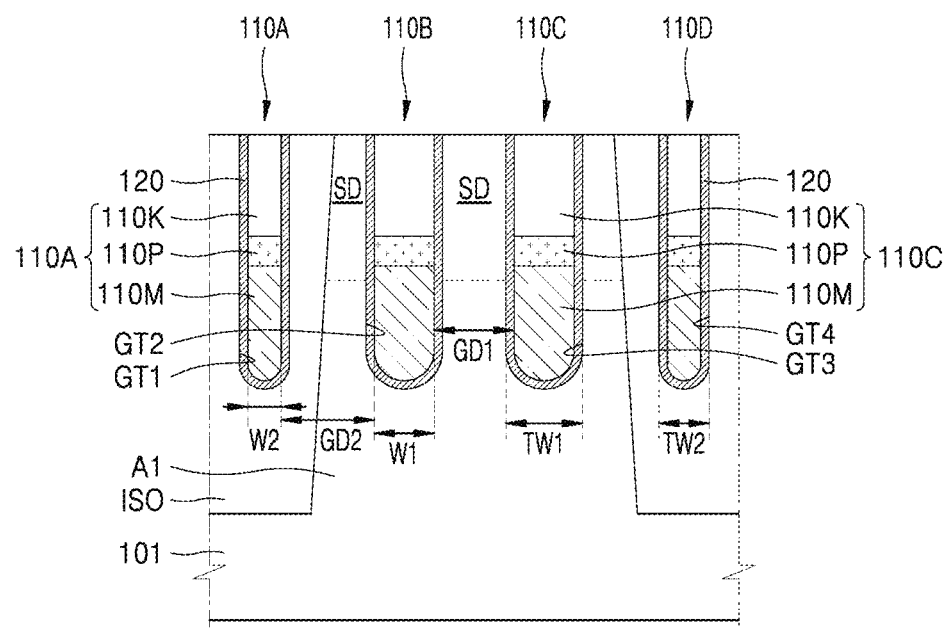

Referring to FIG. 9D, a gate dielectric layer 120 may be formed in each of the gate trenches GT1 to GT4, and a plurality of gate structures 110A to 110D each including a lower gate line 110M, an upper gate line 110P, and a capping layer 110K may be formed on the gate dielectric layer 120.

The gate dielectric layer 120 may be formed by thermal oxidization performed on the active region A1 or deposition performed on a dielectric material. The thermal oxidization of the active region A1 may be performed by heating the active region A1 at an oxidization atmosphere. The deposition of the dielectric material may be performed by a CVD process, an atomic layer deposition (ALD) process, or a physical vapor deposition (PVD) process, but is not limited thereto. A material of the gate dielectric layer 120 has been described above with reference to FIGS. 4 and 5, and thus, its repetitive description may be omitted.

The material layers (for example, the gate dielectric layer 120, the lower gate line 110M, the upper gate line 110P, and the capping layer 110K) may be formed, and then, by performing an etchback process on each of the materials, the gate structures 110A to 110D may be formed.

In some embodiments, before forming the gate dielectric layer 120, the isolation region ISO may be partially removed through an anisotropic etching process. The semiconductor device illustrated in FIG. 6 may be provided by the anisotropic etching process. In detail, when a portion of the isolation region ISO (particularly, a portion of a floor of each of the gate trenches GT1 to GT4 in the isolation region ISO) is removed, a portion of a floor of each of the gate trenches GT1 to GT4 in the active region A1 may relatively protrude toward an upper portion. Subsequently, when the gate structures 110A to 110D are formed, the semiconductor device may have a wider channel width because the gate structures 110A to 110D partially surround the active region A1 and contact a sidewall contact portion SDL (see FIG. 6) while passing through the active region A1.

After the gate structures 110A to 110D are formed, a direct contact DC and a bit line BL which are electrically connected to the active region A1 at a first location that is on/adjacent one side of each of the gate structures 110B and 110C may be formed. Also, a capacitor CAP electrically connected to the active region A1 at a second location that is on/adjacent the other (e.g., opposite) side of each of the gate structures 110B and 110C may be formed (see FIG. 5). The capacitor CAP may be electrically connected to the active region A1 through an interlayer insulation layer IL1 and a buried contact BC passing through the interlayer insulation layer IL1.

According to a method of manufacturing the semiconductor device according to some embodiments, a semiconductor device having an appropriate operation characteristic and high reliability may be provided.

Though the present inventive concepts have been particularly shown and described with reference to example embodiments thereof, it will be understood that various changes in form and details may be made therein without departing from the scope of the following claims.

What is claimed is:

1. A semiconductor device comprising:
   a substrate comprising a plurality of active regions that extend longitudinally in a direction and an isolation region that electrically isolates the plurality of active regions from each other;
   a gate trench that extends across the plurality of active regions and the isolation region;
   a gate structure that extends in the gate trench; and
   a gate dielectric layer that is between the gate trench and the gate structure, in each of the plurality of active regions,
   wherein the gate structure has a first width in the direction in each of the plurality of active regions and has a second width in the direction in the isolation region that is different from the first width, and
   wherein the first width is about 110% to about 140% of the second width.

2. The semiconductor device of claim 1,
   wherein the gate trench comprises a concave sidewall profile in each of the plurality of active regions,
   wherein the first width is an average value of a plurality of widths in the direction in each of the plurality of active regions, and
   wherein the second width is an average value of a plurality of widths in the direction in the isolation region.

3. The semiconductor device of claim 2, wherein, in each of the plurality of active regions, the gate structure has a convex sidewall profile, based on the concave sidewall profile of the gate trench in each of the plurality of active regions.

4. The semiconductor device of claim 1, wherein the gate structure gradually increases or decreases in width in the direction based on a longitudinal position of the gate structure.

5. The semiconductor device of claim 1, wherein the gate trench has a first trench width in the direction in each of the plurality of active regions and has a second trench width in the direction in the isolation region that is different from the first trench width.

6. The semiconductor device of claim 5, wherein the first trench width is greater than the second trench width.

7. The semiconductor device of claim 1, further comprising:
   a capacitor that is electrically connected to one of the plurality of active regions at a first location that is adjacent a first side of the gate structure; and
   a bit line that is electrically connected to the one of the plurality of active regions at a second location that is adjacent a second side of the gate structure that is opposite the first side.

8. The semiconductor device of claim 1, wherein a first depth of the gate trench in each of the plurality of active regions is substantially equal to a second depth of the gate trench in the isolation region.

9. The semiconductor device of claim 1, wherein a first depth of the gate trench in each of the plurality of active regions is shallower than a second depth of the gate trench in the isolation region.

10. The semiconductor device of claim 1, wherein the gate structure has first and second protruding portions that are opposite each other in the direction in each of the plurality of active regions.

11. The semiconductor device of claim 10,
    wherein the gate structure comprises a first gate structure that is between second and third gate structures of the semiconductor device, and
    wherein the first and second protruding portions protrude toward the second and third gate structures, respectively.

12. The semiconductor device of claim 1,
    wherein the gate structure comprises a first gate structure having first and second protruding portions that are in a first active region among the plurality of active regions,
    wherein the semiconductor device further comprises second and third gate structures that the first gate structure extends between,
    wherein the first protruding portion and a third protruding portion of the second gate structure protrude toward each other in the first active region, and
    wherein the second protruding portion protrudes toward a portion of the third gate structure that is in the isolation region.

13. A semiconductor device comprising:
    a substrate comprising a plurality of active regions that extend longitudinally in a first direction and an isolation region that electrically isolates the plurality of active regions from each other;
    a gate trench that extends across the plurality of active regions and the isolation region;
    a gate structure that extends in the gate trench; and
    a gate dielectric layer that is between the gate trench and the gate structure, in each of the plurality of active regions,
    wherein a width of the gate structure in the first direction bilaterally increases or decreases based on a longitudinal position of the gate structure.

14. The semiconductor device of claim 13,
    wherein the gate structure comprises a word line comprising:
    a first portion in one or more of the plurality of active regions; and
    a second portion in the isolation region, and
    wherein the first portion of the word line is wider, in the first direction, than the second portion of the word line.

15. The semiconductor device of claim 13, wherein the gate structure has a convex sidewall profile in each of the plurality of active regions.

16. The semiconductor device of claim 15,
    wherein, in the isolation region, the width of the gate structure decreases along a second direction away from one of the plurality of active regions, and
    wherein the second direction intersects the first direction.

17. A semiconductor device comprising:
    a substrate comprising a plurality of active regions that extend longitudinally in a direction and an isolation region that electrically isolates the plurality of active regions from each other;
    a first gate trench and a second gate trench that each extend across the plurality of active regions and the isolation region, the first gate trench being adjacent the second gate trench;
    a first gate structure and a second gate structure that extend in the first gate trench and the second gate trench, respectively;
    a first gate dielectric layer that is between the first gate trench and the first gate structure, in the plurality of active regions;

a second gate dielectric layer that is between the second gate trench and the second gate structure, in the plurality of active regions;

a third gate trench that extends across the isolation region and across a first of the plurality of active regions that the second gate trench extends across; and a third gate structure that extends in the third gate trench, wherein a distance between the first gate structure and the second gate structure in the direction varies based on a longitudinal position of each of the first and second gate structures, wherein the distance between the first gate structure and the second gate structure in the direction comprises a first distance by which a portion of the first gate structure and a portion of the second gate structure are spaced apart from each other in a second of the plurality of active regions, and wherein a portion of the third gate structure that is in the isolation region is spaced apart from the portion of the first gate structure that is in the second of the plurality of active regions by a second distance in the direction that is longer than the first distance.

18. The semiconductor device of claim 17, wherein the distance between the first gate structure and the second gate structure in the direction gradually varies based on the longitudinal position of each of the first and second gate structures.

19. The semiconductor device of claim 18, wherein the first gate structure and the second gate structure are separated from each other in the direction by a third distance where the first gate structure passes through a third of the plurality of active regions and the second gate structure passes through the isolation region, and wherein the first distance is shorter than the third distance.

20. The semiconductor device of claim 17, wherein a first lowermost level of each of the first and second gate trenches in each of the plurality of active regions is equal to or higher than a second lowermost level of each of the first and second gate trenches in the isolation region.

* * * * *